(12) United States Patent
Murthy et al.

(10) Patent No.: US 6,214,679 B1
(45) Date of Patent: Apr. 10, 2001

(54) COBALT SALICIDATION METHOD ON A SILICON GERMANIUM FILM

(75) Inventors: Anand Murthy; Robert S. Chau, both of Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/476,393

(22) Filed: Dec. 30, 1999

(51) Int. Cl.[7] .................................................. H01L 21/336
(52) U.S. Cl. ........................ 438/299; 438/259; 438/294; 438/589; 438/595; 438/604
(58) Field of Search ..................... 438/259, 299, 438/294, 300, 301, 305, 306, 589, 595, 664

(56) References Cited

U.S. PATENT DOCUMENTS

| 5,624,869 | * | 4/1997 | Agnello et al. | 438/602 |
| 5,883,003 | * | 3/1999 | Matsubara | 438/655 |
| 6,037,922 | * | 3/2000 | Yagyu | 345/89 |

* cited by examiner

*Primary Examiner*—Long Pham
(74) *Attorney, Agent, or Firm*—Blakely, Sokoloff, Taylor & Zafman LLP

(57) ABSTRACT

A method of forming a cobalt germanosilicide film is described. According to the present invention a silicon germanium alloy is formed on a substrate. A cobalt film is then formed on the silicon germanium alloy. The substrate is then heated to a temperature of greater than 850° C. for a period of time less than 20 seconds to form a cobalt germanium silicide film.

23 Claims, 13 Drawing Sheets

COBALT SALICIDATION METHOD ON A SILICON GERMANIUM FILM

BACKGROUND OF THE INVENTION

1. Field of the Invention

The present invention relates to the field of semiconductor manufacturing and more specifically to a cobalt silicide film on a silicon germanium alloy.

2. Discussion of Related Art

Today literally millions of individual transistors are coupled together to form very large-scale integrated (VSLI) circuits, such as microprocessors, memories, and application specific integrated circuits (IC's). Presently, the most advanced IC's are made up of approximately three million transistors, such as metal oxide semiconductor (MOS) field effect transistors having gate lengths on the order of 0.25 $\mu$m. In order to continue to increase the complexity and computational power of future integrated circuits, more transistors must be packed into a single IC (i.e., transistor density must increase). Thus, future ultra large-scale integrated (ULSI) circuits will require very short channel transistors with effective gate lengths less than 0.1 $\mu$m. Unfortunately, the structure and method of fabrication of conventional MOS transistors cannot be simply "scaled down" to produce smaller transistors for higher density integration.

The structure of a conventional MOS transistor 100 is shown in FIG. 1. Transistor 100 comprises a gate electrode 102, typically polysilicon, formed on a gate dielectric layer 104 which in turn is formed on a silicon substrate 106. A pair of source/drain extensions or tip regions 110 are formed in the top surface of substrate 106 in alignment with outside edges of gate electrode 102. Tip regions 110 are typically formed by well-known ion implantation techniques and extend beneath gate electrode 102. Formed adjacent to opposite sides of the gate electrode, 102 and over tip regions 110 are a pair of sidewall spacers 108. A pair of source/drain contact regions 120 are then formed, by ion implantation, in substrate 106 substantially in alignment with the outside edges of sidewall spacers 108.

As device features are continually scaled down, the source/drain contact resistance negatively impacts device performance. It has been proposed to deposit silicon germanium alloys 122 on the source/drain contract regions 120 to form raised source/drain regions which help reduce the source/drain contact resistance. Generally a low resistance silicide is formed by a self-aligned process, known as a salcide process, on the source/drain regions. Unfortunately, however, present techniques are unable to form a low resistance cobalt silicide film on silicon germanium alloys.

SUMMARY OF THE INVENTION

A method of forming a cobalt germanosilicide film is described. According to the present invention a silicon germanium alloy is formed on a substrate. A cobalt film is then formed on the silicon germanium alloy. The substrate is then heated to a temperature of greater than 850° C. for a period of time less than 20 seconds to form a cobalt germanosilicide film.

DETAILED DESCRIPTION OF THE PRESENT INVENTION

A novel method for forming a cobalt silicide film on a silicon germanium alloy is described. In the following description numerous specific details are set forth such as specific materials, dimensions, and processes etc. in order to provide the through understanding in the present invention. It will be obvious, however, to one skilled in the art that the present invention may be practiced without the specific details. In other instances well known semiconductor equipment and processes have not been described in particular detail in order to avoid unnecessarily obscuring the present invention.

The present invention is a novel cobalt (Co) salicidation process carried out on a silicon germanium alloy. According to the present invention a cobalt film is deposited on to a silicon germanium alloy formed on a substrate. The substrate is then heated to a temperature greater than 850° C. an ideally to greater 900° C. for a period of time of less than 20 seconds and ideally less than 10 seconds. The high temperature short length anneal suppresses germanium rejection from the phase during transformation to cobaltdigermanosilicide Co (SiGe)$_2$. By preventing germanium separation from the phase a very low resistance, than 4 ohms/sq, cobaltgermanosilicide film can be formed. In an embodiment of the present invention a low resistant cobalt germano silicide film is formed by a salicide (self-aligned) process during the formation of an (MOS) metal oxide semiconductor device having silicon germanium source/drain regions.

The present invention will be described with respect the formation and salicidation of a novel p-channel MOS (PMOS) device. One skilled in the art will appreciate the ability to form and salicide an nMOS device in a similar manner except that the doping conductivity types will be reversed. Additionally, the cobalt salicidation process of the present invention can be used to form devices other than MOS devices such as bipolar devices. The novel salicidation process of the present invention can be used anywhere a low resistance cobalt silicide film is desired on a silicon germanium alloy region.

Figure 2:
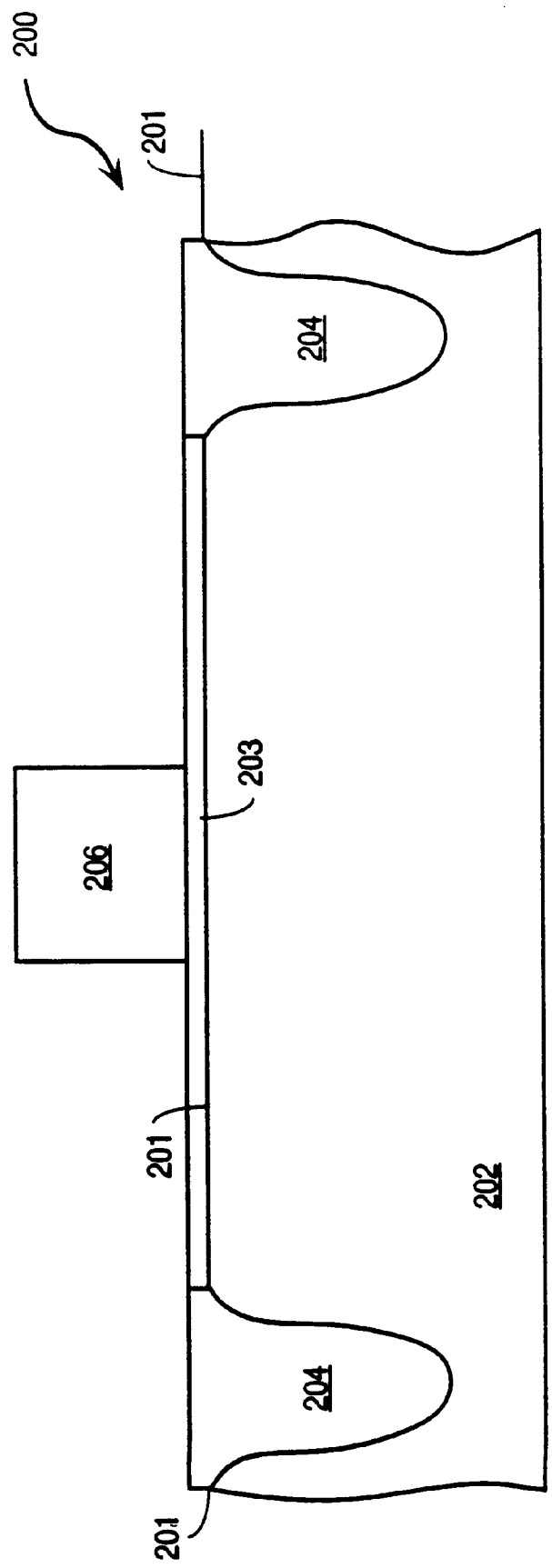
FIG. 2 is an illustration of a cross-sectional view of a substrate having a gate dielectric layer and a gate electrode.

FIG. 2 illustrates a substrate 200 which includes a partially fabricated p-type metal oxide semiconductor device (PMOS). Substrate 200 includes a plurality of field isolation regions 204 used to isolate wells of different conductivity types and to isolate adjacent transistors. Field isolation regions 204 are preferably shallow trench isolation (STI) regions formed by etching a trench into substrate 200 and then filling the trench with a deposited oxide. Although STI isolation regions are preferred because of their ability to be formed to small dimensions with a high degree of planarity, other methods can be used such as but not limited to local isolation of silicon (LOCOS), recessed LOCOS, or silicon on insulator (SOI), and suitable insulators, other than oxides, such as nitrides may be used if desired.

Silicon substrate 200 includes an n-type region 202 having a conductivity in the range of $1 \times 10^{17}/cm^3 - 1 \times 10^{19} \ cm^3$ formed between isolation region, 204. According to a preferred embodiment the n-type conductivity region 202 is an n-well formed by a first implant of phosphorous atoms as a dose of $4 \times 10^{13}/cm^3$ at an energy of 475 keV, a second implant of phosphorous atoms at a dose of $2.5 \times 10^{12}/cm^3$ at an energy of 60 keV and a final implant of arsenic atoms at a does of $1 \times 10^{13}/cm^3$ at an energy of 180 keV into a silicon substrate 200 having a concentration of $1 \times 10^{16}/cm^3$ in order to produce an n-well 202 having an n-type concentration of approximately $7.0 \times 10^{17}/cm^3$. It is to be appreciated that n-type conductivity region 202 may be formed by other means including providing initially doped substrate, or depositing an insitu doped semiconductor material with a desired conductivity. According to the present invention a substrate is defined as a starting material on which the transistor of the present invention is fabricated and in embodiment includes n-well 202.

A gate dielectric layer 203 is formed on the top surface 201 of substrate 200 is shown in FIG. 2. Gate dielectric layer 203 is preferably a nitrided oxide layer formed to a thickness between 5–30 Å with 8 Å being preferred. It is to be appreciated other well known gate dielectric layers such as oxides, nitrides, and combination thereof may be utilized if desired. A gate electrode 206 is formed on gate dielectric layer 203 formed on n-well 202. Gate electrode 206 is preferably formed from a 1000–3500 Å thick layer of blanket deposited polysilicon pattern into a gate electrode 206 with well known photolithographic techniques. If desired the polysilicon layer can be ion implanted or insitu doped to the desired conductivity type and level prior to patterning. It is to be appreciated that other well known patterning techniques may be utilized to pattern the polysilicon layer into gate electrode 206 including submicron lithography techniques, such as e-beam and x-ray, and subphotolithographic patterning techniques such as described in U.S. Pat. No. 5,434,093 entitled "Inverted Spacer Transistor" and assigned to the present Assignee. According to the preferred method of the present invention polysilicon gate electrode 206 has a drawn length down to 50 nm (500 Å). Additionally, although gate electrode 206 is preferably a polysilicon electrode, gate electrode 206 can be but not limited to metal gates, a single crystalline silicon gate, or any combinations thereof if desired.

Figure 3:
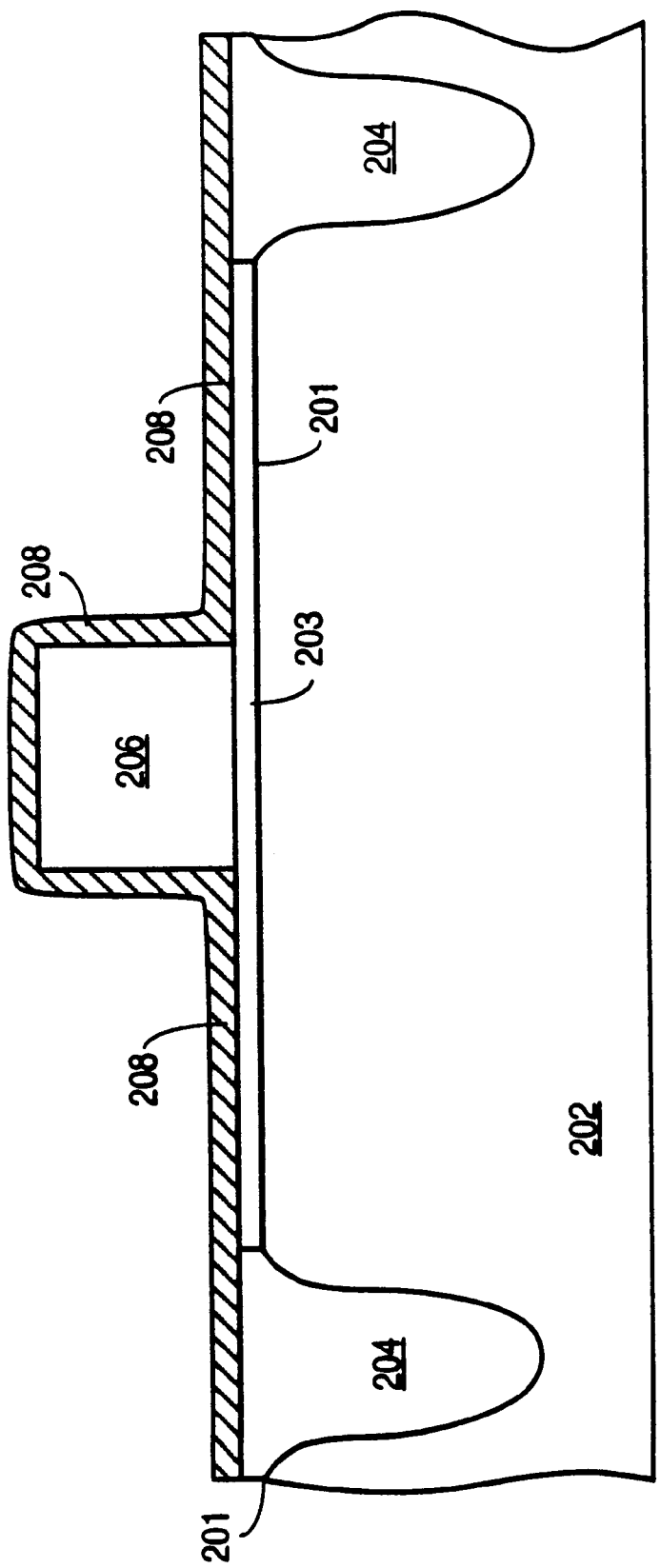
FIG. 3 is an illustration of a cross-sectional view showing the formation of a spacer material on the substrate of FIG. 2.

According to the present invention a thin spacer layer 208 is formed over substrate 200 including oxide 203 on surface 201 and the top and sides of gate electrode 206 as shown in FIG. 3. Spacer layer 208 will subsequently be used to form sidewall spacers for the MOS device. Spacer layer 210 is formed to a thickness between 50–300 Å. It is to be appreciated that spacer layer 208 must be formed thick enough to electrically isolate a subsequently deposited silicon germanium film from gate electrode 206.

Spacer layer 208 is preferably silicon nitride film formed by a "hotwall" process to achieve a hermetic seal of gate electrode 206 and the edges of gate dielectric 203. By forming a silicon nitride spacer layer 208 directly on the gate electrode 206 a hermetic seal is formed and hot electron lifetime of the fabricated transistors dramatically improved. A silicon nitride layer 208 can be formed by a low pressure chemical vapor deposition (LPCVD) process by reacting ammonia ($NH_3$) and dichlorosilane (DCS) at a pressure of approximately 10 pascals and at a temperature of approximately 80° C. Although a hot wall silicon nitride layer is preferred in the present invention because of the hermetic seal it forms, any other suitable insulating layer, such as a deposited oxide or a composite oxide/silicon nitride film, can be used if desired.

Figure 4:
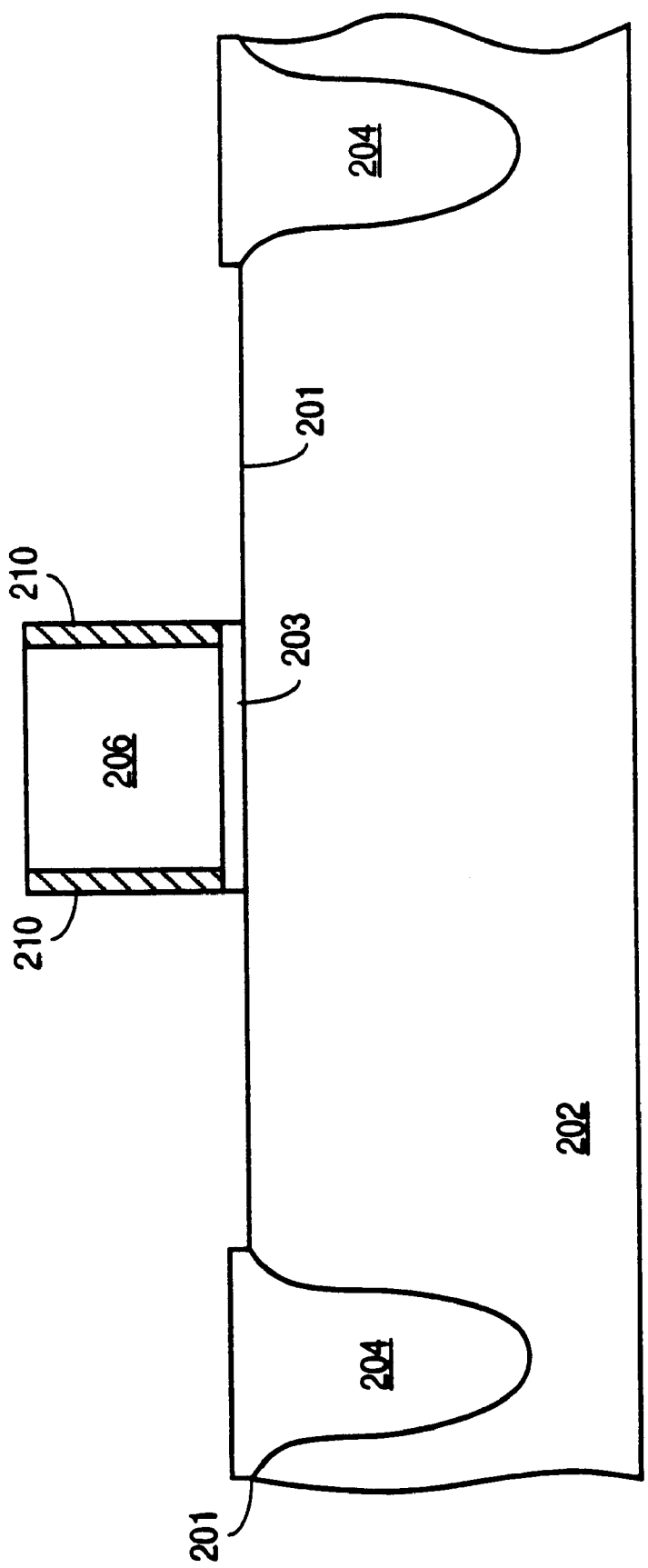
FIG. 4 is an illustration of a cross-sectional view showing the formation of spacers from the spacer layer on the substrate of FIG. 3.

Next, as shown in FIG. 4, spacer layer 208 is anisotropically dry etched to form a pair of thin sidewall spacers 210 which run along laterally opposite sidewalls of gate electrode 206. According to an embodiment of the present invention silicon nitride spacers 210 are formed by anisotropically plasma etching a silicon nitride spacer layer 208 using chemistry comprising $C_2F_6$ and a power of approximately 200 watts. The anisotropic etch is continued until all of the spacer material has been removed from the substrate surface 201 and from the top of gate electrode 206. Additionally, at this time oxide 203 on substrate surface 201 over the source/drain regions is also removed. In a preferred embodiment of the present invention sidewall spacers having a thickness of between 50–300 Å are formed.

Figure 5:
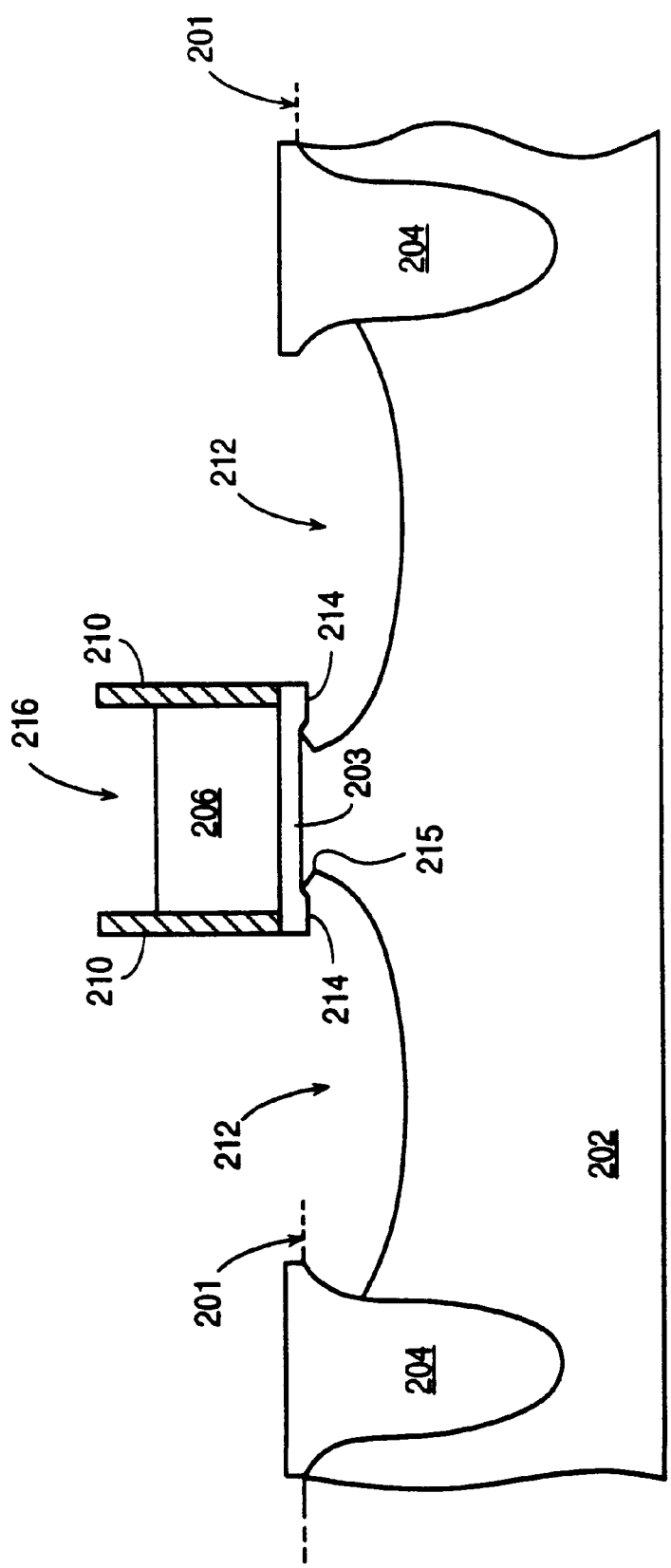
FIG. 5 is an illustration of a cross-sectional view showing the formation of recesses in the substrate of FIG. 4.

Next, as shown in FIG. 5, recesses 212 are formed is substrate 200 along laterally opposite sidewalls of gate electrode 206. In a preferred embodiment of the present invention an "isotropic" etch process is used to form lateral recess 212 as illustrated in FIG. 5. An isotropic etch not only etches vertically into the substrate but also etches horizontally (laterally) beneath the sidewall spacers 210 and gate electrode 206. Such as lateral recess etch can be produced by using an "isotropic" dry etch process in a parallel plate RF plasma etching system using a gas mix chemistry comprising $SF_6$ and helium (He) and process conditions which favor isotropy. Such conditions include high pressure and low RF power density. In one embodiment of the present invention, a process pressure of approximately 900 mT, a gap of 1.1 cm, an RF power of 100 W, a He flow of 150 sccm, and a SF6 flow of 100 sccm is used. RF power may be varied in a range, for example, of 50 W to 200 W, and the process pressure may be varied but should be greater than approximately 500 mT.

Not only does such an etching process produce lateral recesses but the etch chemistry is also highly selective to the gate oxide and to the thin nitride spacer material. In this way the spacers 210 and gate dielectric 203 are not etched during the silicon etch and the integrity of the thin nitride spacers 210 and gate dielectric 203 preserved.

Another advantage of the etch process used to form the lateral recess is that the etch chemistry is slightly oxidizing. Utilizing an oxidizing etchant causes the portion 214 of the gate oxide layer 203 exposed during the recess etch to become thicker than the unexposed portion of the oxide layer. By increasing the thickness of the gate oxide layer at the edge of the gate electrode, the gate edge leakage at the tip overlap region of the device is reduced. A thicker gate dielectric layer at the gate edge helps to increase the breakdown voltage of the device.

Yet another advantage of the lateral recess etch process of the present invention is that the etch rate can be made slow, between 5–30 Å per second, which causes the etch of the silicon substrate to concave inwards and form an inflection point 215 as shown in FIG. 5. With this geometry, a large $L_{MET}$ (metallurgical channel length or physical channel length) is achieved during the off state (low $I_{off}$) while a smaller $L_{MET}$ is realized during the on state when the channel is formed. A smaller $L_{MET}$ during the on state directly translates to a smaller channel resistance and enhance a higher $I_{on}$. Although a dry etch is preferred in the present invention a wet etch can also be used if desired.

In an embodiment of the present invention recesses 212 have a maximum vertical depth of between 100–1500 Å below substrate surface 201 and extend between 25–200 Å horizontally or laterally beneath the gate electrode edge 206 at the channel/gate dielectric interface with the maximum lateral recess occurring at the inflection point 215 which extends between 50–250 Å laterally beneath the edge of gate electrode 206 at a depth of between 25–100 Å below substrate surface 201. It is to be appreciated that alternative process conditions and etch chemistries can be utilized to generate other recess geometry profiles is desired.

In an alternative embodiment of the present invention, an anisotropic etch is used to form recesses 212 which are etched only in the vertical direction into the substrate and which do not extend laterally beneath the sidewall spacers 210 in gate electrode 206. In an embodiment of the present invention, silicon nitride spacers 210 and recesses 212 are formed "insitu" using a chemistry comprising of $C_2F_6$ to both etch the spacers and the recesses. If vertical recesses are formed then an anneal may be necessary to drive dopants from subsequently deposited silicon germanium source/drain regions to beneath the gate electrode.

Figure 6:
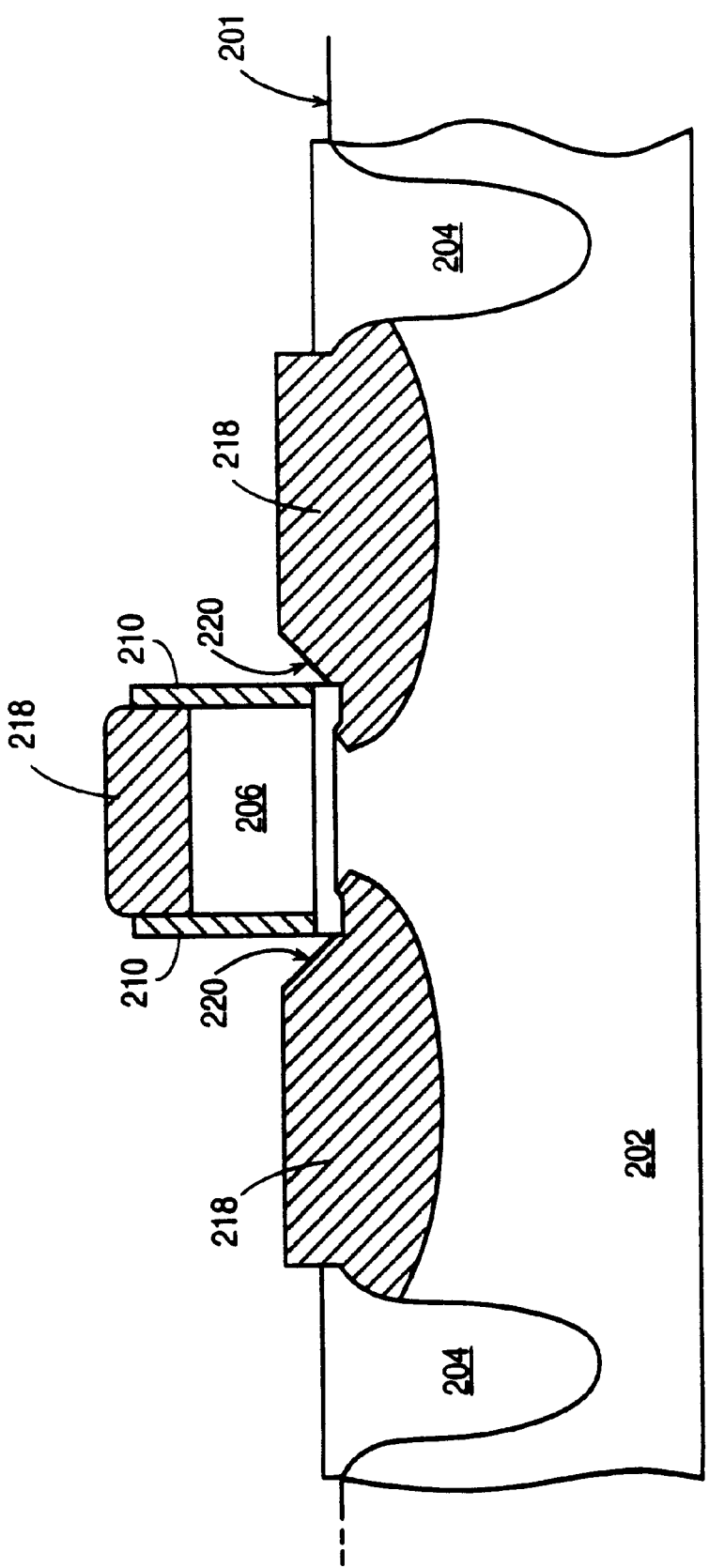
FIG. 6 is an illustration of a cross-sectional view showing the formation of a silicon germanium alloy in the recesses in the substrate of FIG. 5.

Next, the recesses are filled with a deposited silicon germanium ($Si_xGe_{100-x}$) alloy as shown in FIG. 6. In an embodiment of the present invention an insitu doped silicon germanium alloy having between 10–50 atomic percent germanium is selectively deposited into recess 212 and onto the top gate electrode 206. Silicon germanium alloy 218 is selectively deposited so that it forms only on exposed silicon, such as on n-well 202, in recesses 212 and the top of polysilicon gate electrode 206 and not on dielectric regions such as silicon nitride spacers 210 and isolation regions 204. The silicon germanium alloy 218 is insitu doped with p-type impurities to a concentration level between $1\times10^{18}/cm^3$–$3\times10^{21}/cm^3$ with a concentration of approximately $1\times10^{21}/cm^3$ being preferred. Silicon nitride spacers 210 electrically isolate silicon germanium alloy 218 formed in recesses 212 from gate electrode 206. Silicon germanium alloy 218 is formed to a thickness of between 200–2000 Å with approximately 500 Å being preferred in this way the silicon germanium alloy 218 is formed both above and below surface 201 of semiconductor substrate 200. By forming silicon germanium 218 above substrate surface 201, a "raised" tip is formed which increases the conductivity of the tip which in turns improves device performance. By forming raised tip regions in the present invention, shallow tips can be formed and good punch through characteristics obtained.

According an embodiment of the present invention, the silicon germanium alloy 218 is formed by a decomposition of approximately 20 sccm of dichlorosilane ($SiH_2Cl_2$) approximately 50–180 sccm of one percent hydrogen diluted germanium ($GeH_4$) and a p-type dopant source of approximately 5–100 sccm of one percent hydrogen diluted diborane $B_2H_6$ at a temperature of between 600°–800° C. with 700° C. being preferred and a pressure of approximately 10–200 torrs with 165 torrs being preferred. In order to increase the selectivity of the deposition process, approximately 5–60 sccm of HCl can be added to the gas composition if desired. A silicon germanium material exhibits good selectivity to silicon during deposition. Additionally, such a silicon germanium semiconductor alloy exhibits many microscopic "faults" and "dislocation" which aid in the solid state diffusion of dopants through the silicon germanium alloy.

In an embodiment of the present invention the majority of the boron dopants added during the silicon germanium film deposition are not activated at this time. That is, after deposition boron atoms are in the silicon germanium film but have not yet substituted into silicon sites in the lattice where they can provide a hole (lack of an electron). In an embodiment of the present invention thermal activation of the dopants is deferred until during the conversion anneal of the present invention. In this way dopant diffusion is reduced due to a reduction in the thermal budget which enables a very abrupt source/drain junction to be formed which dramatically improves device performance.

In an embodiment of the present invention as illustrated in FIG. 6, the silicon germanium alloy is deposited so that a (311) facet 220 is introduced during deposition. It is to be appreciated that the thickness and doping concentration level of the silicon germanium alloy 218 determines a resistivity of the tip portion of the fabricated pMOS transistor. A thicker and higher doped silicon germanium alloy results in a transistor with a lower parasitic resistance. An adverse capacitance (i.e., Miller capacitance), however, can develop when opposite voltages are placed on gate electrode 206 and silicon germanium source/drain regions 218. The higher the doping and the greater the thickness of the silicon germanium alloy 218 extends above surface 201, the greater is the Miller capacitance. Thus, by adding facet 220 during deposition, the silicon germanium alloy 218 is spaced further away from the gate electrode which reduces the capacitance and which enables thicker and higher doping of the silicon germanium alloy regions 218 to be utilized.

Figure 7:
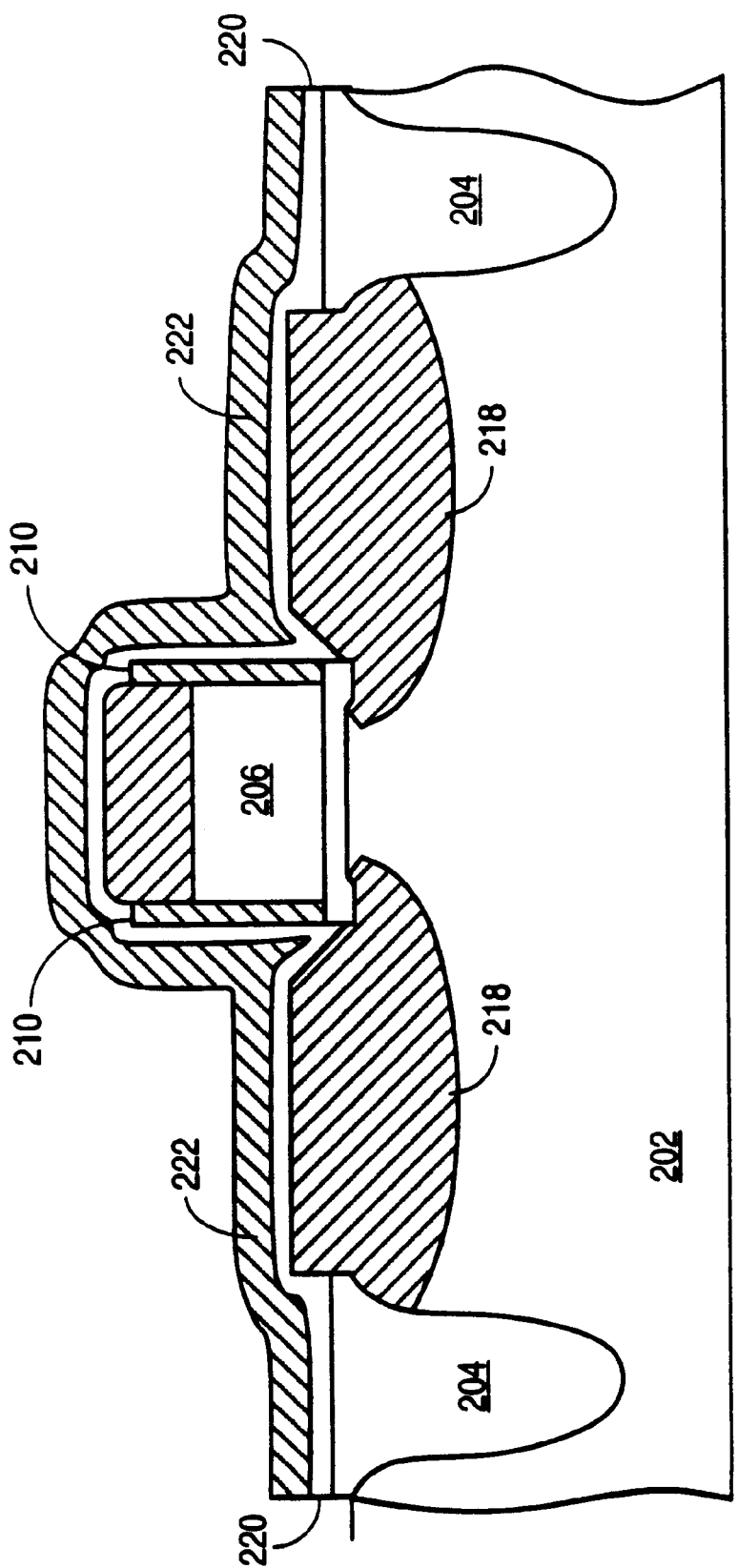
FIG. 7 is an illustration of a cross-sectional view showing the formation of a thin oxide layer and a silicon nitride layer on the substrate of FIG. 6.

Next, as shown in FIG. 7, a thin, approximately 50–100 Å chemical vapor deposited (CVD) oxide layer 222 is blanket deposited over substrate 200 including silicon germanium film 218, sidewall spacers 210 and isolation regions 204. Oxide layer 222 can be formed by any well known CVD process. In a preferred embodiment however the deposition temperature is kept below 750° C. in order to not activate or disturb the dopants in the silicon germanium alloy. An oxide deposition temperature of approximately 650° C. is preferred. Next, a substantially thicker, 500 to 1800 Å with 800 Å, CVD silicon nitride layer 224 is blanket deposited onto oxide layer 220. Silicon nitride layer 224 is preferably formed by a standard CVD "hot wall" process at a temperature below 750° C. and a temperature of 750° C. being ideal. By keeping the silicon nitride deposition temperature relatively low the thermal budget is kept down and the deposition rate and uniformity made more controllable. Oxide layer 220 buffers the large stress inherent silicon nitride layer 222 and provides an etch step for silicon nitride layer 222 during a subsequent spacer etch.

Figure 8:
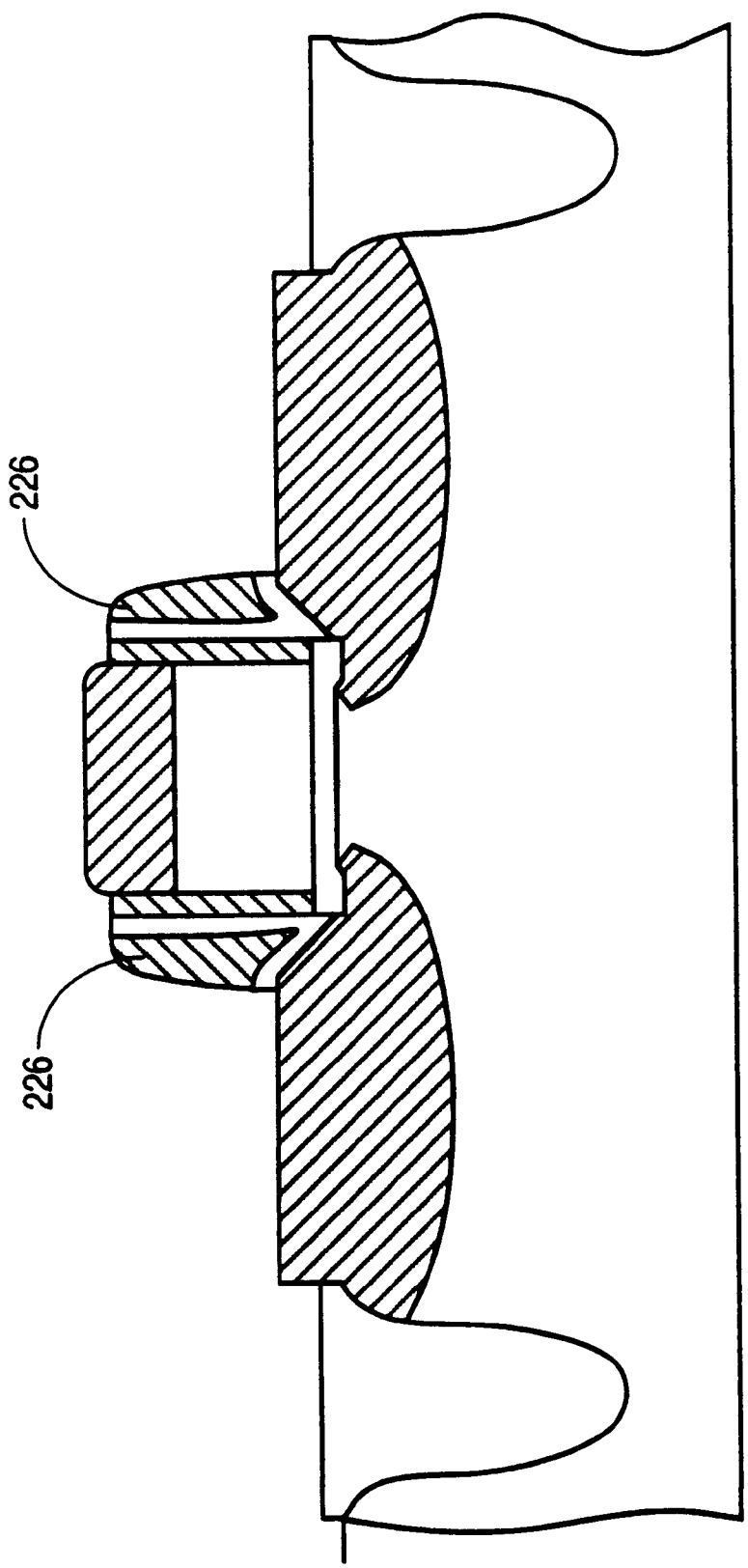
FIG. 8 is an illustration of a cross-sectional view showing the formation of a second pair of sidewall spacers on the substrate of FIG. 7.

Next, silicon nitride layer 222, and oxide layer 220, are anisotropically etched to form a pair of composite spacers 226 adjacent to the first pair of silicon nitride spacers 210 as shown in FIG. 8. Any well known silicon nitride and oxide etchant process may be used to anisotropically etch silicon nitride layer 222 and buffer oxide layer 220. Additionally, it is to be appreciated that although composite spacers are utilized a single nitride or oxide layer can be used to form spacers 226 if desired. Spacers 226 are used to separate a silicide on the source/drain regions from a silicide on the gate region and/or to offset a high energy high dose implant from the active channel region. In an embodiment of the present invention spacers 226 have a thickness between 500–2000 Å.

Figure 9:
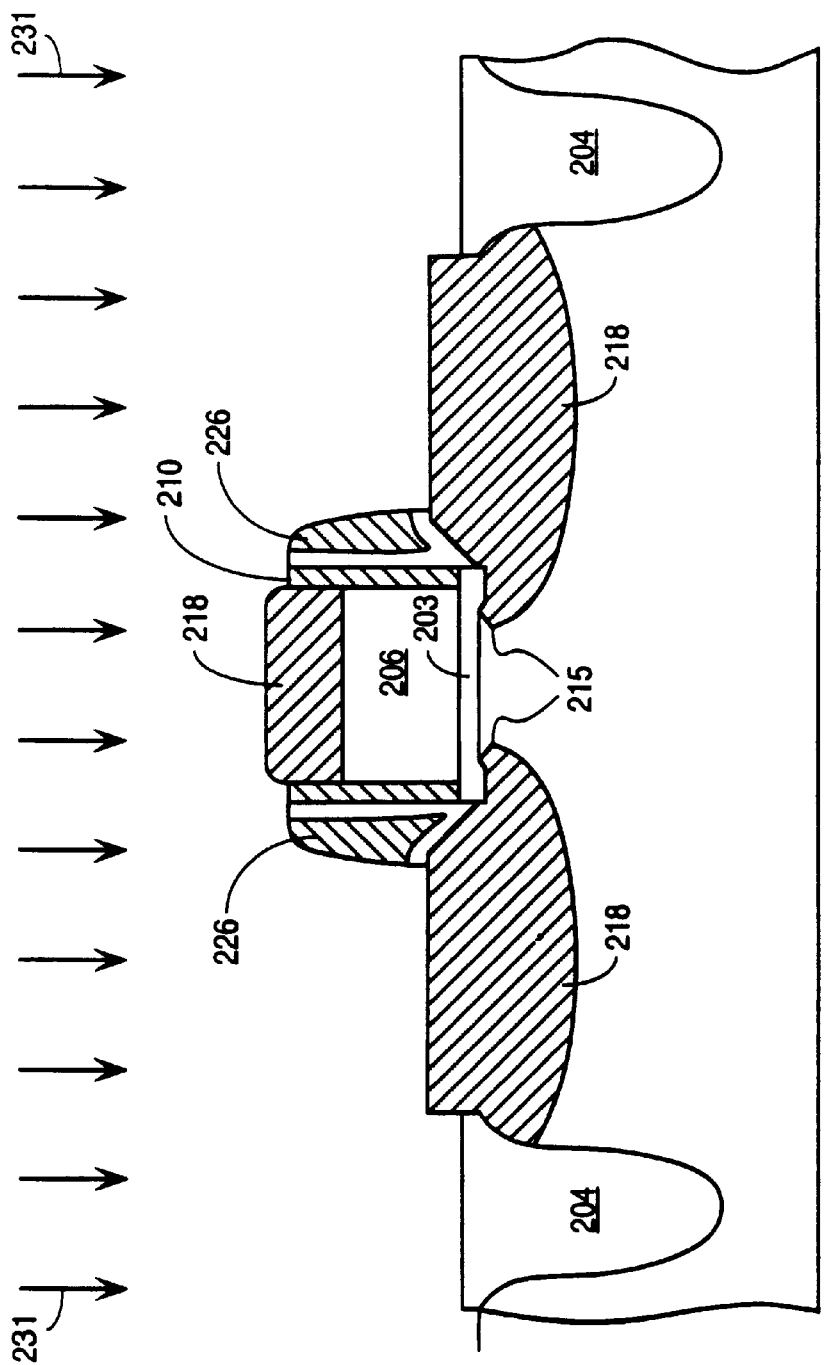
FIG. 9 is an illustration of a cross-sectional view showing the formation of high energy deep source/drain implants into the substrate of FIG. 8.

Next, as shown in FIG. 9 if desired a high energy deep source/drain implant can be made at this time into substrate 200. The high concentration p-type implant 231 is made into silicon germanium alloy 218 in alignment with the outside edges of composite spacers 226 in order to further increase the doping concentration level of the source/drain contact regions of the pMOS transistors and the gate electrode 206. Spacers 226 and 210 and gate electrode 206 prevent doping of the channel region beneath the gate as well as the silicon germanium film lying beneath the spacers. In this way heavy source/drain implant does not interfere or overwhelm the narrow tip junctions.

Next, the salicidation process of the present invention is utilized to form a low resistance cobaltgermanosilicide film onto the deposited silicon germanium alloy 218 in the source/drain regions and on the top of the gate electrode 206.

Figure 10:
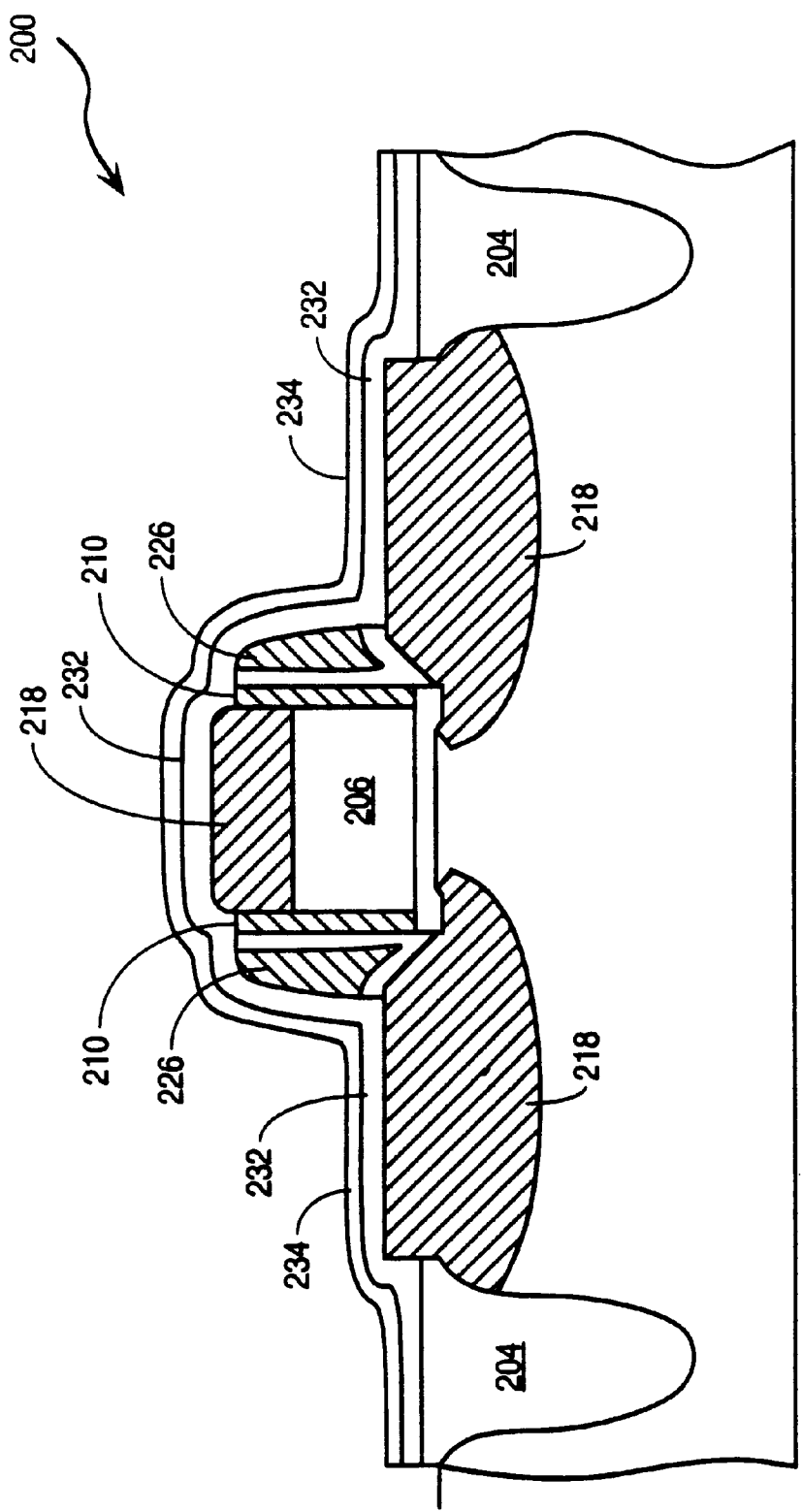
FIG. 10 is an illustration of a cross-sectional view showing the formation of a cobalt film over the substrate of FIG. 9.

According to the salicidation process of the present invention, a cobalt film 232 is blanket deposited over substrate 200 as shown in FIG. 10. The cobalt film 232 is directly deposited onto the silicon germanium alloy 218 in the source/drain regions, over the thick sidewall spacers 226, over the top of the thin sidewall spacers 210, on the silicon germanium alloy 218 on the top of the gate electrode 206 as well as onto isolation regions 204. In an embodiment of the present invention a cobalt film is deposited to a thickness of between 100–200 Å. A cobalt film can be formed by any well known method including sputter deposition or chemical vapor deposition. An Applied Materials Endura system can be used to sputter deposit a cobalt film.

Next, as also shown in FIG. 10, a capping layer 234, of for example titanium nitride, is deposited directly onto cobalt film 232. In an embodiment of the present invention the capping layer is titanium nitride formed to a thickness of between 50–200 Å. Titanium nitride capping layer 234 can be formed by any well known technique such as by sputter deposition utilizing an Applied Materials Endura system or can be deposited by chemical vapor deposition. Capping layer 234 protects the underlying cobalt layer 232 from oxidation during a subsequent silicide anneal.

Figure 11:
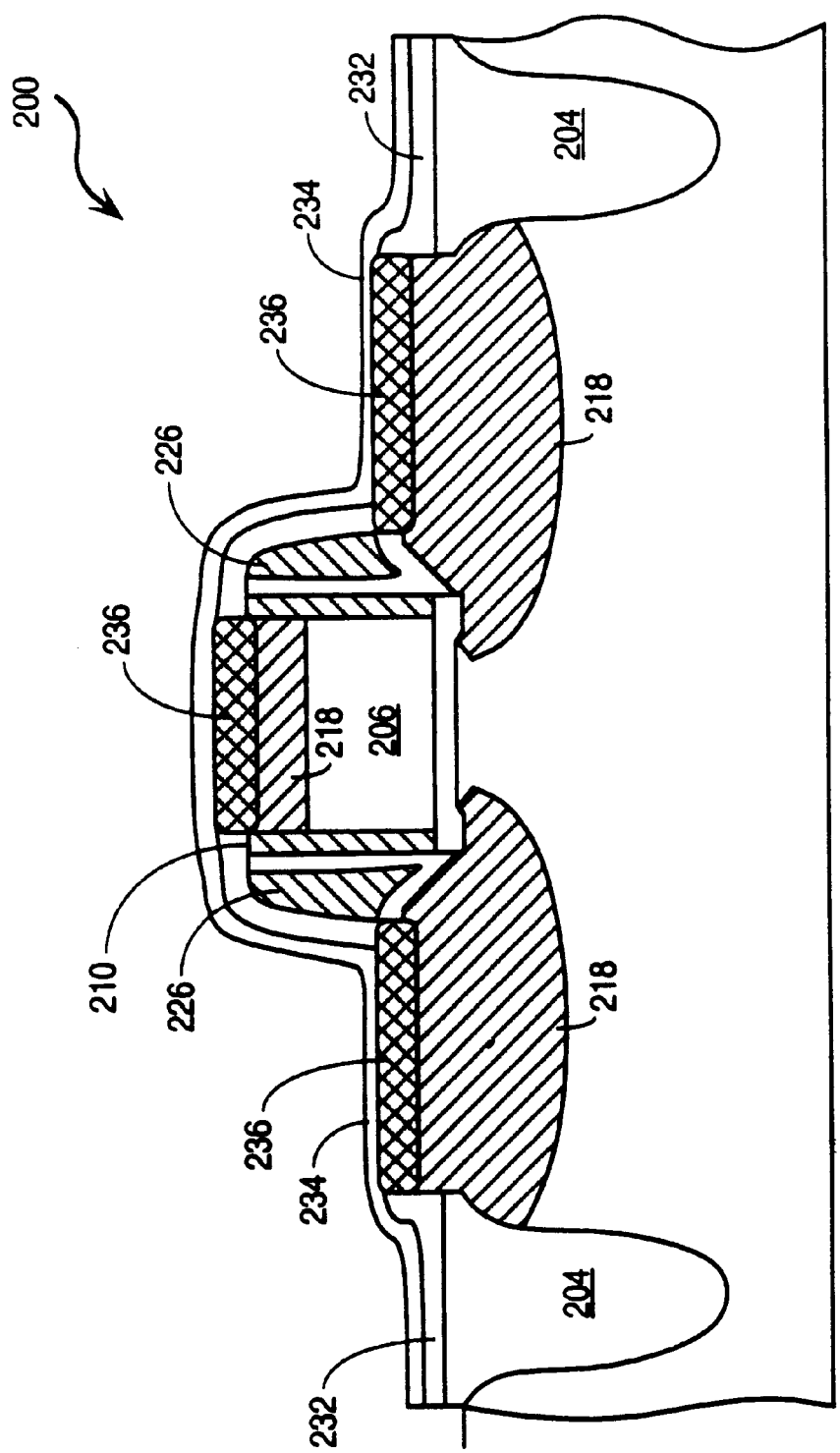
FIG. 11 is an illustration of a cross-sectional view showing the formation of a monocobaltgermanosilicide film on the substrate of FIG. 10.

Next, substrate 200 is heated to a temperature and for a period of time sufficient to cause the cobalt film to react with any underlying silicon germanium alloy to form a monocobaltgermanosilicide film Co ($Si_xGe_{100-x}$) as shown in FIG. 11. Monocobaltgermanosilicide is formed at all locations where silicon germanium 218 is available to react with the cobalt. Cobalt remains unreacted at locations where no silicon germanium or silicon is available for reactions such as dielectric spacers 226 and 210 and dielectric isolation region 204. In order to react cobalt with silicon germanium in order to form the monocobaltgermano silicide phase, substrate 200 can be heated in an inert ambient, such as $N_2$, to a temperature between 400–500° C. with about 460° C. being preferred for a period of time between 45–120 seconds with 90 seconds being preferred. Substrate 200 can be suitably annealed in an AMAT 5000 or 5200 RTP processor. Such a heating step causes the reaction of cobalt and silicon germanium to form a monocobaltgermanosilicide phase film 236 having a mean sheet resistance of between 11–14 ohms per square.

Figure 12:
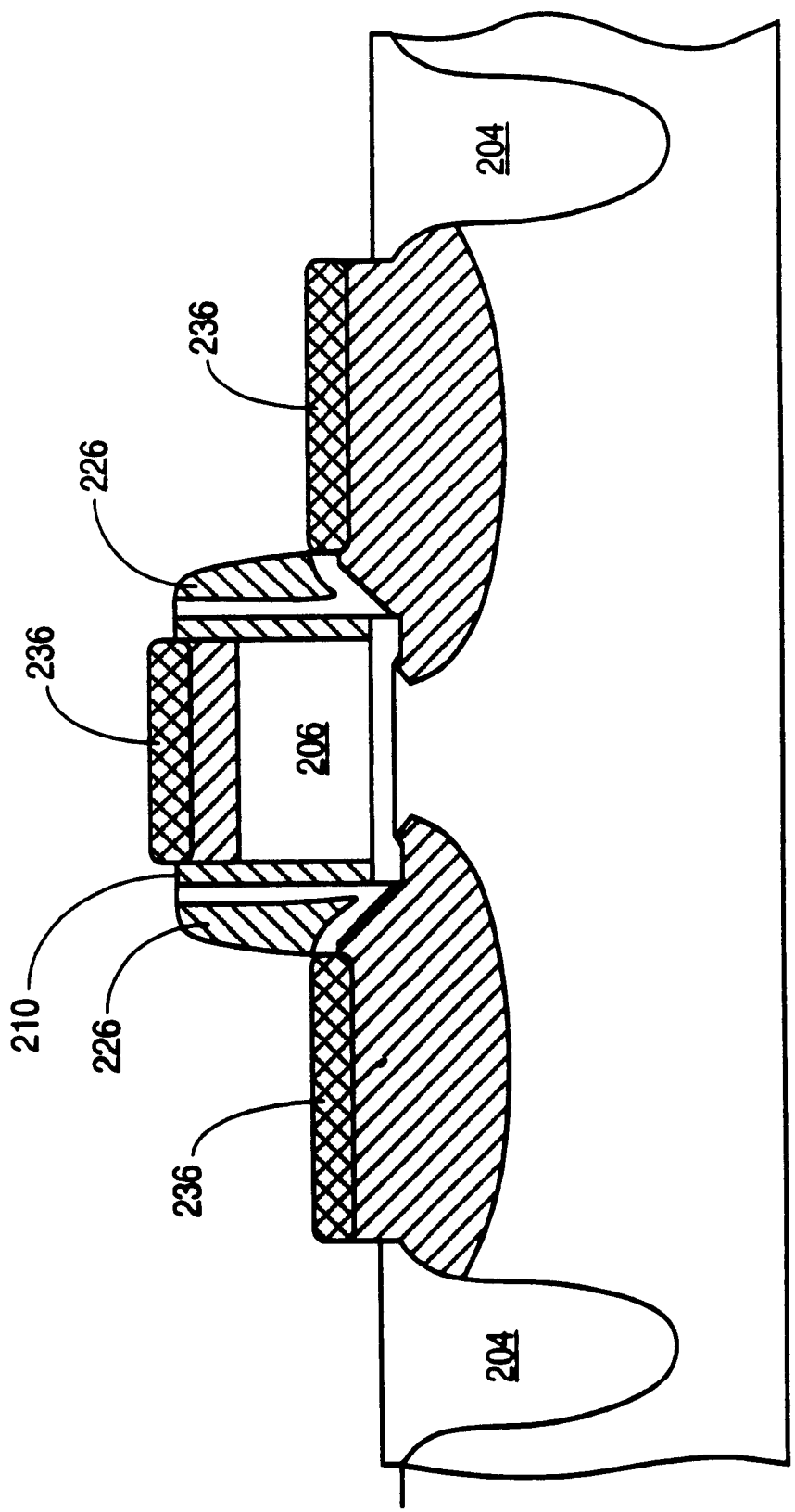
FIG. 12 is an illustration of a cross-sectional view showing the removal of unreacted cobalt from the substrate of FIG. 11.

Next, unreacted cobalt 232 (and the over lying titanium nitride capping layer 234) on the spacers and isolation regions is removed while leaving the formed monocobaltgermanosilicide film 236 as shown in FIG. 12. Unreacted cobalt 232 can be removed without removing monocobaltgermanosilicide 236 by exposing substrate 200 to a 50:1 buffered HF wet etch for between 90–150 seconds with 120 seconds being preferred. After the wet etch, monocobalt germano silicide 236 remains on the source/drain regions and on the gate electrode 206 are electrically isolated from one another by the spacers 230 and isolation regions 204. After the wet etch, the resistance of the monocobaltgermano silicide film 236 increases to between 50–90 ohms per square.

Figure 13:
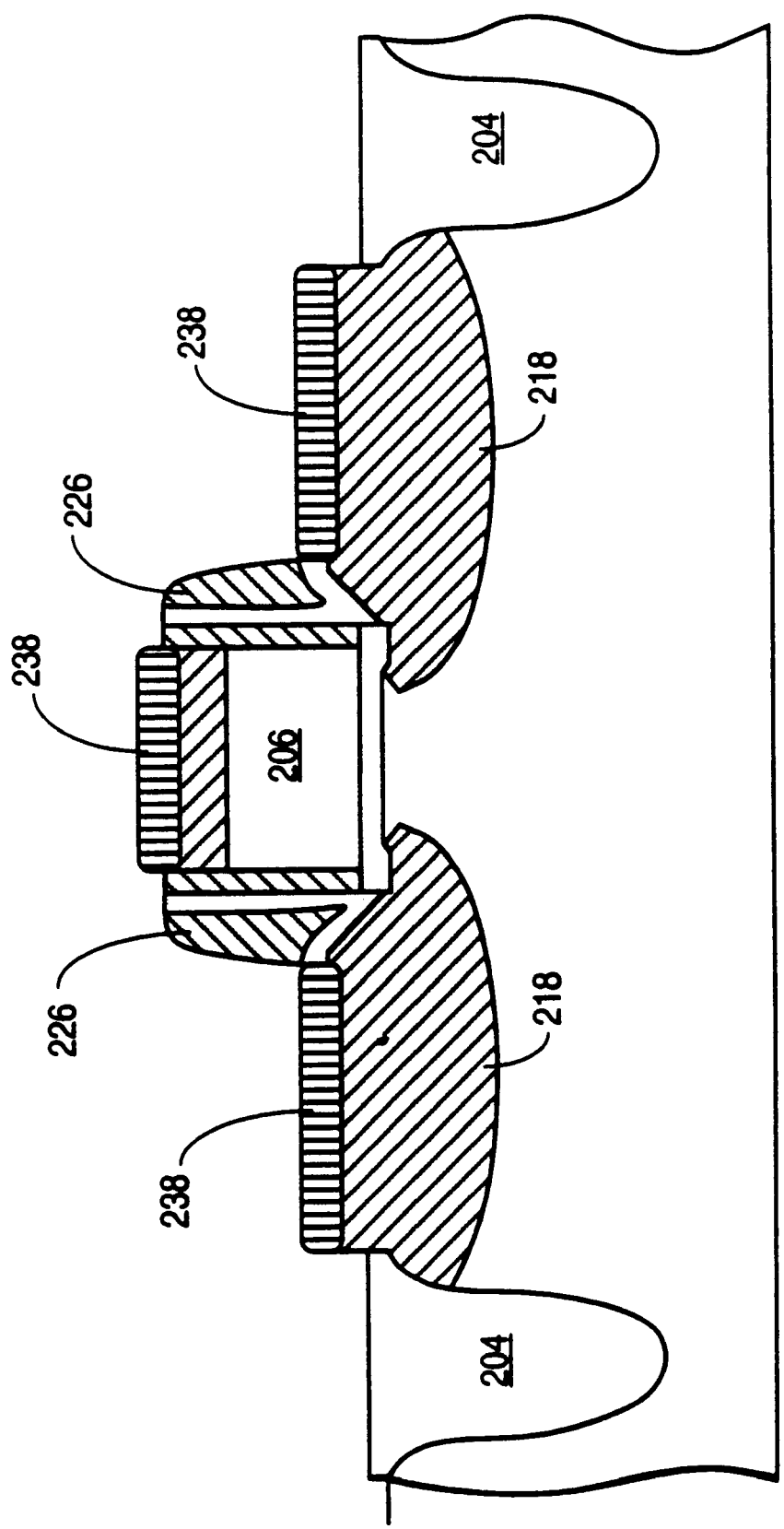
FIG. 13 is an illustration of a cross-sectional view showing the conversion of the monocobaltgermanosilicide Co(Si$_x$Ge$_{100-x}$) film on the substrate of FIG. 12 into a cobaltdigermanosilicide Co(Si$_x$Ge$_{100-x}$)$_2$ film.

Next, as shown in FIG. 13, substrate 200 is heated to cause the monocobaltgermano Co ($Si_xGe_{100-x}$) silicide phase film 236 to convert into the low sheet resistance cobaltdigermanosilicide Co ($Si_xGe_{100-x})_2$ phase 238. According to the present invention a non equilibrium rapid thermal anneal is utilized to convert or transform the monocobaltgermanosilicide Co ($Si_xGe_{100-x}$) phase into the cobaltdigermanosilicide Co ($Si_xGe_{100-x})_2$ phase. According to the present invention substrate 200 is heated in an inert ambient such as N2 to a relatively high temperature of greater than 850° C. and preferably greater than 920° C. for a relatively short period of time, of less than 20 seconds and preferably less than 15 seconds and ideally less than 10 seconds. The non equalibrium conversion anneal of the present invention can be accomplished in an AMAT 5000 or 5200 rapid thermal processor. The relatively high temperature short duration non equalibrium anneal of the present invention prevents germanium rejection from the phase system. That is, since the conversion anneal occurs in relatively short period of time germanium is not given a sufficient time to separate out of the silicon germanium alloy to form precipitates at the grain boundaries. By keeping the conversion anneal time short germanium rejection is suppressed leaving germanium homogeneously spread throughout the film. By preventing germanium rejection a homogeneous cobaltdigermaiumsilicide film 238 having a resistivity of between 2–5 ohms /square can be formed.

Additionally, in an embodiment of the present invention substrate 200 has not been subjected to any activation or drive anneals prior to the non equilibrium conversion anneal of the present invention. In this way the non equilibrium conversion anneal is the anneal which activates the dopants in the silicon germanium alloy as well as any dopants implanted during the source/drain implant. That is, in an embodiment of the present invention the non equilibrium conversion anneal is used to thermally activate the insitu deposited and implanted boron atoms by causing them to occupy silicon sites in the lattice so they can be electrically active. At this point the fabrication of a novel transistor having a self-aligned cobaltdigermanosilicide Co ($Si_xGe_{100-x})_2$ film is complete.

Although the cobalt self-aligned silicide process of the present invention has been described with respect to the fabrication of a p-MOS device having a specific structure, it is to be appreciated that the present invention can be used to form a low resistance cobalt silicide on an arsenic or phosphorus (n-type) doped silicon germanium film. For example, the process of the present invention can be used to form a low resistance silicide on an n-MOS device formed by the above described process except that the recesses are formed in a p-type substrate region having a conductivity in the range of $1\times10^{17}/cm^3$–$1\times10^{19}/cm^3$ and are filled with the an n-type silicon germanium alloy having a doping density between $1\times10^{18}/cm^3$–$3\times10^{21}/cm^3$ with a concentration of approximately $1\times10^{20}/cm^3$ being preferred. Such an n-type silicon germanium alloy can be formed by decomposition of approximately 20–250 sccm with preferably 200 sccm of dichlorosilane ($SiH_2Cl_2$), approximately 25–200 with preferably 50 sccm of 1% hydrogen diluted germanium ($GeH_4$) and an n-type dopant source of approximately 100–400 sccm with preferably 200 sccm hydrogen diluted phosphane ($PH_3$) at a temperature between 500–700° C., with 575° C. being preferred, and at preferably atmospheric pressure. In order to increase the selectivity of the deposition process approximately 5–60 sccm of HCl can be added to the gas composition if desired.

Still further the present invention can be used to form a low resistance cobalt silicide film on undoped silicon germanium alloys. For example the salicidation process of the present invention can be used to form a silicide on undoped or intrinsic silicon germanium formed on source/drain regions. In such a case the silicon germanium film acts as a sacrificial layer that is completely consumed during the cobalt salicidation process. Although a specific MOS structure has been described. It is to be appreciated that the cobalt silicide process of the present invention can be integrated into the fabrication of any device structure where a low resistance cobalt silicide on a silicon germanium alloy is desired.

Thus, a novel method of forming a self-aligned cobalt silicide film on a silicon germanium alloy has been described.

We claim:

1. A method of forming a cobalt germanium silicide film comprising:

forming a silicon germanium alloy on a substrate;

forming a cobalt film on said silicon germanium alloy;

heating to a temperature greater than 850° C. for a period of time less than 20 seconds to form a cobaltdigermanosilicide Co $(Ge_xSi_{100-x})_2$ film.

2. The method of claim 1 further comprising wherein said silicon germanium alloy comprises between 10–30 atomic percent germanium.

3. The method of claim 1 wherein said heating step occurs in an inert ambient.

4. The method of claim 1 wherein said silicon germanium alloy is doped with boron.

5. The method of claim 1 wherein said silicon germanium alloy is doped with phosphorus.

6. The method of claim 1 wherein said silicon germanium alloy is undoped.

7. A method of forming a cobalt germanium silicide film comprising:

providing a substrate having a dielectric region and a silicon germanium alloy region;

forming a cobalt film over said silicon germanium alloy region and over said dielectric region;

heating said substrate to a temperature between 400°–500° C. to form a monocobaltgermanosilicide Co $(Ge_xSi_{100-x})$ film on said silicon germanium alloy region and to leave unreacted cobalt on said dielectric region;

removing said unreacted cobalt from said dielectric region;

heating said substrate to a temperature greater than 850° C. for a period of time less than 20 seconds in order to form a cobaltdigermanosilicide Co $(Ge_xSi_{100-x})_2$ film.

8. The method of claim 7 further comprises the step of forming a titanium nitride layer directly on said cobalt film prior to forming said monocobaltgermano Co $(Ge_xSi_{100-x})$ suicide film.

9. The method of claim 7 wherein said substrate is heated to a temperature between 850° C. to 1000° C. while forming said cobaltdigermano silicide Co $(Ge_xSi_{100-x})_2$ film.

10. The method of claim 7 wherein said unreated cobalt is removed with a solution comprising buffered hydroflouric acid.

11. The method of claim 7 wherein the silicon germanium alloy is doped with boron.

12. The method of claim 7 wherein the silicon germanium alloy is doped with phosphorus.

13. The method of claim 7 wherein the silicon germanium alloy is undoped.

14. A method of forming a an MOS transistor comprising:

providing a substrate having an MOS transistor comprising a gate dielectric, a gate electrode, a pair of dielectric sidewalls spacers along laterally opposite sidewalls of said gate electrode, and a pair of silicon germanium source/drain regions;

forming a cobalt film over said MOS transistor including said silicon germanium film and said dielectric spacers;

forming a titanium nitride film over said cobalt film;

heating said substrate to a temperature between 400°–500° C. to form a monocobaltgermanosilicide film Co $(Ge_xSi_{100-x})$ on said pair of silicon germanium source/drain regions and to leave unreacted cobalt on said dielectric sidewall spacers;

removing said unreacted cobalt from said dielectric area; and heating said substrate to a temperature greater than 850° C. for a period of time less than 20 seconds in order to form a cobaltdigermanosilicide Co $(Ge_xSi_{100-x})_2$ film on said silicon germanium source/drain regions.

15. The method of claim 14 wherein the silicon germanium source/drain regions are doped with boron.

16. The method of claim 14 wherein the silicon germanium source/drain regions are doped with phosphorus.

17. The method of claim 14 wherein the silicon germanium source/drain regions are undoped.

18. A method of forming an MOS transistor comprising:

forming a gate electrode on a gate dielectric layer;

forming a pair of dielectric sidewall spacers along laterally opposite sides of said gate electrode;

forming a silicon germanium alloy on opposite sides of said gate electrode adjacent to said sidewall spacers, wherein said silicon germanium alloy has dopants contained therein;

forming a cobalt film over said silicon germanium alloy, over said dielectric spacers and over said gate electrode; and heating said substrate to a temperature greater than 850° C. for a period of time less than 20 seconds to form a cobaltdigermanosilicide Co $(Ge_xSi_{100-x})_2$ film on said silicon germanium alloy and to activate said dopants in said silicon germanium alloy.

19. The method of claim 18 wherein the silicon germanium alloy is doped with boron.

20. The method of claim 18 wherein the silicon germanium alloy is doped with phosphorus.

21. A method of forming a silicide comprising:

forming a silicon germanium alloy;

forming cobalt film on said silicon on said silicon germanium alloy;

heating said cobalt film and said silicon germanium alloy to a first temperature and for a first period of time to form a monocobaltgermanosilicide CO $(Ge_xSi_{100-x})$; and heating said monocobaltgermanosilicide film CO $(Ge_xSi_{100-x})$ to a temperature greater than approximately 850° C. for a period of time of less than approximately 20 seconds to convert said monocobaltgermanosilicide CO $(Ge_xSi_{100-x})$ to cobaltdigermanosilicide film Co $(Ge_xSi_{100-x})_2$.

22. A method of forming a silicide comprising:

forming a silicon germanium alloy;

forming a cobalt film on said silicon germanium alloy;

reacting said cobalt film and said silicon germanium alloy to form a homogeneously cobaltdigermanosilicide film Co $(Ge_xSi_{100-x})_2$ having a resistivity between 2–4 ohms/square.

23. A method of forming a silicide comprising:

forming a silicon germanium alloy;

forming a cobalt film on said silicon germanium alloy;

heating said silicon germanium alloy and said cobalt film to a temperature and for a period of time sufficient to form cobaltdigermanosilicide film Co $(Ge_xSi_{100-x})_2$ and to suppress germanium rejection from said cobaltdigermanosilicide film Co $(Ge_xSi_{100-x})_2$.

\* \* \* \* \*

UNITED STATES PATENT AND TRADEMARK OFFICE
CERTIFICATE OF CORRECTION

PATENT NO.    : 6,214,679 B1
DATED         : April 10, 2001
INVENTOR(S)   : Murthy et al.

Figure 1:
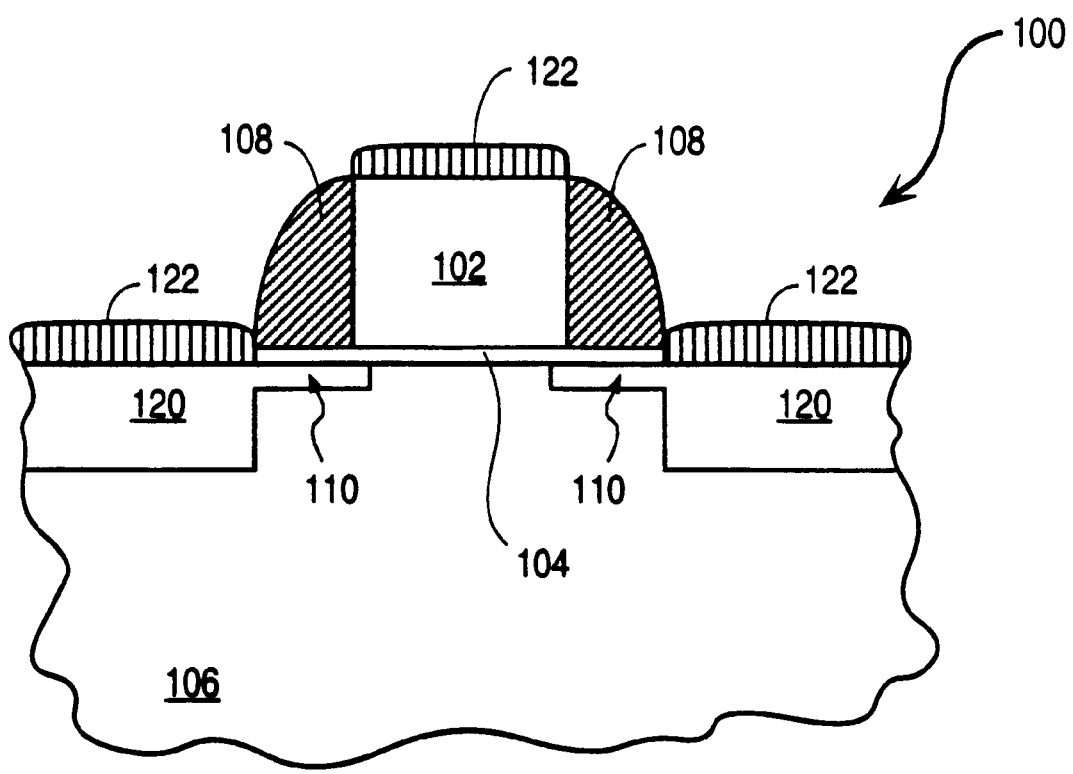
FIG. 1 is an illustration of a cross-sectional view of a conventional MOS transistor.

It is certified that error appears in the above-identified patent and that said Letters Patent is hereby corrected as shown below:

Drawings,
FIG. 1, underneath the legend "FIG. 1" insert -- PRIOR ART --.

Column 10,
Line 9, delete "suicide film" and insert -- silicide film --.

Signed and Sealed this

Twentieth Day of August, 2002

Attest:

Attesting Officer

JAMES E. ROGAN
Director of the United States Patent and Trademark Office